United States Patent [19]

Charles et al.

[11] 4,419,125
[45] Dec. 6, 1983

[54] METHOD FOR THE PREPARATION OF BRITTLE SUPERCONDUCTING MATERIAL IN ULTRAFINE PARTICLE FORM

[75] Inventors: Robert G. Charles, Hampton; John R. Gavaler, Penn Hills Township, Allegheny County, both of Pa.

[73] Assignee: Westinghouse Electric Corp., Pittsburgh, Pa.

[21] Appl. No.: 436,103

[22] Filed: Oct. 22, 1982

[51] Int. Cl.$^3$ ............................................. H01L 39/12
[52] U.S. Cl. .............................. 75/0.5 B; 75/0.5 BB; 148/11.5 P; 148/126.1; 29/599
[58] Field of Search .................. 148/11.5 P, 126, 133, 148/11.5 F; 75/0.5 B, 0.5 BB; 29/599

[56] References Cited

U.S. PATENT DOCUMENTS 4,050,147  9/1977  Winter et al. .................. 75/0.5 BB
4,149,876  4/1979  Rerat ............................... 75/0.5 BB
4,231,790  11/1980  Hähn et al. ..................... 75/0.5 BB Primary Examiner—W. Stallard
Attorney, Agent, or Firm—R. A. Stoltz

[57] ABSTRACT

This is a method for preparing submicron-superconducting particles for use in forming a ductile superconductor wire from brittle superconducting compounds. The method utilizes preparing a mixture of solid metal halides containing essentially stoichiometric proportions of metallic components for the desired superconducting compound, co-reducing the mixture with an excess of liquid alkali metal, removing the alkali metal halide produced and the excess alkali metal from the superconducting powder, and annealing the superconducting powder to substantially remove absorbed hydrogen as indicated by the reduction of lattice parameters to essentially nominal values.

13 Claims, No Drawings

METHOD FOR THE PREPARATION OF BRITTLE SUPERCONDUCTING MATERIAL IN ULTRAFINE PARTICLE FORM

CROSS-REFERENCE TO RELATED APPLICATION

A submicron-particle superconducting wire is described in related applications Ser. No. 293,537 assigned to the same assignee. That related application describes a superconducting arrangement using submicron particles in close proximity. A ductile wire having superconducting properties can be made in that manner using an inherently brittle superconducting material such as niobium carbide. The related application referenced U.S. Pat. No. 4,050,147 issued to Winter on Sept. 27, 1977 as disclosing a hydrogen plasma reaction for producing the submicron-superconducting powder. The present invention is an alternate method of making submicron-superconducting powder.

BACKGROUND OF THE INVENTION

The present invention relates to a method for making submicron-superconducting powders and is especially applicable to powders of superconducting materials which lack sufficient ductility to allow the materials to be drawn into a wire.

Superconducting wires have been made in a configuration in which a plurality of superconducting filaments are embedded in a normal (non-superconducting) metal matrix using superconducting material which is relatively ductile. However, in the case of brittle materials, which includes all of the known high-$T_c$ ($T_c \sim 15K$) superconductors, this fabrication technique has not proved satisfactory. Presently, most methods for making conductors from brittle superconductors involve a process in which the conductor is fabricated into its final shape and then the constituent elements of the superconductor are reacted in situ to form the (brittle) compound. That method has been used, for example, to prepare $Nb_3Sn$ and $V_3Ga$ multifilamentary conductors. Alternately, the technique of the above-described related application involves forming the superconducting compound in the form of a fine powder and then drawing this powder (which is encapsulated in a tube of normal metal) to make the superconducting wire. Preferably, the submicron particles have a smooth surface and are generally spherical in shape.

SUMMARY OF THE INVENTION

This is a method for preparing submicron particles of superconducting powder for use in forming ductile superconductor wire of brittle superconducting compounds. The method comprises preparing a mixture of solid metal halides in essentially stoichiometric proportions, coreducing the mixture with an excess of liquid alkali metal, removing the alkali metal halide and the excess alkali metal from the superconductor powder (preferably by rinsing the resultant powder with alcohol and then rinsing with water), and annealing the powder to remove absorbed gases. The resultant powder is superconducting at essentially its theoretical temperature and is generally spherical and can be used to form a ductile superconductor wire using brittle superconducting compounds.

DESCRIPTION OF THE PREFERRED EMBODIMENTS

This method provides a new and convenient method for preparing smooth and generally spherical particles of brittle high-$T_c$ superconducting compounds, in a form suitable for preparing ductile superconducting wire. The procedure makes use of co-reduction, by an excess of an alkali metal, of a mixture made up of stoichiometric quantities of metal halides. The reaction is conveniently carried out, under relatively mild conditions. For a given compound, the required temperature can be determined by, for example, raising the temperature of the reaction mixture linearly with time and using differential temperature measurements, for example, to measure heat of reaction and thus to determine when the reaction is complete.

An example of the preparation of a high-$T_c$ superconducting compound by the halide co-reduction method is the synthesis of the Al5 structure compound, $Nb_3Sn$ by reaction (1)

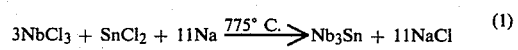
$$3NbCl_3 + SnCl_2 + 11Na \xrightarrow{775^\circ C.} Nb_3Sn + 11NaCl \quad (1)$$

The corresponding bromides or iodides can be substituted for chlorides in (1), and other alkali metals could be substituted for sodium. Excess Na and the NaCl by-product in (1) were removed by subsequent treatment with alcohol followed by water. Alternately, liquid ammonia could be used for a sodium removing rinse.

Initial experiments did not produce material which was superconducting of the predicted temperature. We believe that gases, especially hydrogen from the rinse step reaction (2) below, were absorbed by the product ($Nb_3Sn$) to produce lattice expansion and loss of superconducting properties.

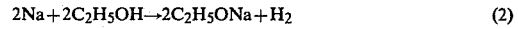
$$2Na + 2C_2H_5OH \rightarrow 2C_2H_5ONa + H_2 \quad (2)$$

However, as discussed below, the gases were driven off by annealing of the isolated $Nb_3Sn$, with a restoration of superconductivity.

Reaction (1) probably proceeds by individual reduction of the respective halides followed by rapid interaction of the initially formed particulate individual metals [reactions (3) to (5)].

$$NbCl_3 + 3Na \rightarrow Nb + 3NaCl \quad (3)$$

$$SnCl_2 + 2Na \rightarrow Sn + 2NaCl \quad (4)$$

$$3Nb + Sn \rightarrow Nb_3Sn \quad (5)$$

The desired products of reactions (1), (3), (4), and (5) form as spherical particles with diameters in the 100 to 1000 A size range, but are typically below 500 A. This is in the range desired for the preparation of filamentary superconducting wire. Of great advantage, from a practical standpoint, is that the finely particulate $Nb_3Sn$, despite its resulting large surface area, is not pyrophoric but rather can be handled easily in contact with air and even with liquid water.

X-ray analysis of the $Nb_3Sn$ powder after rinsing showed it to have the Al5 structure with an unexpectedly large lattice parameter, $a_o = \sim 5.40$ A (the nominal lattice parameter for stoichiometric $Nb_3Sn$ is 5.29 A.)

Also the powder was not superconducting above 4.2K. Annealing the powder for ½ hour at 600° C. reduced $a_o$ to 5.29 A and it now had a $T_c$ of about 17K, close to the optimum value of 18K for $Nb_3Sn$. It is thought that the lattice expansion and the corresponding degradation of $T_c$ was due to the absorption of hydrogen into the lattice.

While the alkali metal halide and the excess alkali metal can conveniently be removed with an alcohol rinse followed by a water rinse, the powders could, for example, be separated from liquid sodium by centrifuging at a slightly elevated temperature and then distilling off any remaining sodium and the halides later removed by, for example, a water rinse. Removing sodium by distillation alone, or partly (or possibly even entirely) by centrifuging, has the advantage of allowing the sodium to be easily recycled. Regardless of the method of separating the reaction products, a final anneal should be used. The time and temperature of this anneal can be established by measuring lattice parameters and comparing the lattice parameters to the known values for the material. Lattice parameters larger than nominal indicate the need for further annealing. Higher temperature anneals will, of course, not require as long a time. Generally, annealing times of at least 10 minutes and temperatures of at least 400° C. are preferred.

As noted in the aforementioned related application, preferably the superconducting material should be a so-called high field superconductor that exhibits high values of the upper critical field ($H_{c2}$), transition temperature ($T_c$) and critical current density ($J_c$). These materials and in particular the high-$T_c$ superconductors consisting of two elements of the type $A_3B$, having an A15 crystal structure, are known to be extremely hard and brittle. Included in this group are the intermetallic compounds of the metals niobium or vanadium with other elements including such compounds as: $Nb_3Sn$, $Nb_3Al$, $Nb_3Ga$, $Nb_3Ge$, $V_3Si$, and $V_3Ga$. The ternary (pseudobinary) A15 intermetallic compounds such as niobium-aluminum-germanium, $Nb_3(Al, Ge)$, and the B1 crystal structure high-field niobium nitride, NbN, and niobium carbonitride, Nb(N, C); e.g., $NbN_{1-x}C_x$ for $x \approx 0.3$, and Cheverel phases such as $PbMo_6S_8$ are also preferred compositions. As will be exemplified herein, even the moderately high-$T_c$ compound niobium carbide, NbC, is useful as it demonstrates the principle of the present invention.

It is to be understood that the invention is not limited to the embodiment set forth herein for purposes of exemplification, but is to be limited only by the scope of the attached claims, including the full range of equivalents to which each element thereof is entitled.

We claim:
1. A method of preparing submicron particles of superconducting powder, said method comprising:
   (a) preparing a mixture of metal halides, the metal components of said halides being in essentially stoichiometric proportions for the desired superconducting compound;
   (b) co-reducing said mixture of metal halides with an excess of liquid alkali metal to produce a metallic compound powder and an alkali metal halide;
   (c) removing said alkali metal halide and the excess alkali metal from said powder;
   (d) annealing said powder to render said powder superconducting at essentially the theoretical temperature of said compound whereby a superconducting powder is produced which is generally spherical and can be used to form a ductile superconductor wire.

2. The method of claim 1, wherein said alkali metal halide and excess alkali metal are removed with an alcohol rinse followed by a water rinse.

3. The method of claim 1 wherein said alkali metal is sodium.

4. The method of claim 2 wherein said alkali metal is sodium.

5. The method of claim 1 wherein said metal halides are metal chlorides.

6. The method of claim 2 wherein said metal halides are metal chlorides.

7. The method of claim 3 wherein said metal halides are metal chlorides.

8. The method of claim 1 wherein said superconducting compound is selected from the group consisting of $Nb_3Sn$, $Nb_3Al$, $Nb_3Ga$, $Nb_3Ge$, $V_3Si$, $V_3Ga$, $Nb_3(Al,G3)$ NbN, Nb(N,C), and $PbMo_6S_8$.

9. The method of claim 2 wherein said superconducting compound is selected from the group consisting of $Nb_3Sn$, $Nb_3Al$, $Nb_3Ga$, $Nb_3Ge$, $V_3Si$, $V_3Ga$, $Nb_3(Al,Ge)$ NbN, Nb(N,C), and $PbMo_6S_8$.

10. The method of claim 3 wherein said superconducting compound is selected from the group consisting of $Nb_3Sn$, $Nb_3Al$, $Nb_3Ga$, $Nb_3Ge$, $V_3Si$, $V_3Ga$, $Nb_3(Al,Ge)$ NbN, Nb(N,C), and $PbMo_6S_8$.

11. The method of claim 4 wherein said superconducting compound is selected from the group consisting of $Nb_3Sn$, $Nb_3Al$, $Nb_3Ga$, $Nb_3Ge$, $V_3Si$, $V_3Ga$, $Nb_3(Al,Ge)$ NbN, Nb(N,C), and $PbMo_6S_8$.

12. The method of claim 1, wherein said annealing is at greater than about 400° C. for at least 10 minutes.

13. The method of claim 1, wherein said excess alkali metal is at least partially removed by being distilled off and said alkali metal halide is removed by a water rinse.

* * * * *